United States Patent
Lee et al.

(10) Patent No.: US 7,531,422 B2
(45) Date of Patent: May 12, 2009

(54) METHOD FOR FABRICATING CAPACITOR IN SEMICONDUCTOR DEVICE USING HAFNIUM TERBIUM OXIDE DIELECTRIC LAYER

(75) Inventors: Kee-Jeung Lee, Ichon-shi (KR); Jae-Sung Roh, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 154 days.

(21) Appl. No.: 11/652,119

(22) Filed: Jan. 11, 2007

(65) Prior Publication Data

US 2007/0117309 A1    May 24, 2007

Related U.S. Application Data

(62) Division of application No. 10/879,745, filed on Jun. 30, 2004, now abandoned.

(30) Foreign Application Priority Data

Dec. 10, 2003    (KR) ................. 2003-89418

(51) Int. Cl.
*H01L 21/473* (2006.01)
(52) U.S. Cl. ................. 438/396; 438/785; 257/E29.343
(58) Field of Classification Search ................. 438/785; 257/E29.343
See application file for complete search history.

(56) References Cited

U.S. PATENT DOCUMENTS

| 6,190,957 B1 | 2/2001 | Mochizuki et al. |
| 6,664,186 B1 | 12/2003 | Callegari et al. |
| 6,764,770 B2 | 7/2004 | Paranthaman et al. |
| 2001/0016382 A1 | 8/2001 | Song et al. |
| 2003/0104706 A1 | 6/2003 | Mitsuhashi et al. |
| 2004/0214352 A1 | 10/2004 | Kijima et al. |
| 2004/0245602 A1 | 12/2004 | Kim et al. |
| 2005/0136689 A9 | 6/2005 | Vaartstra |

OTHER PUBLICATIONS

Hartmanove et al., Structure and physical Properties of Stabilized Hafnia R2O3 (R=scandium, . . . Er), Mat. Chem. and Phys., 1993, vol. 34(2), pp. 175-180.
Kim et al., "Lanthanide (Tb) Doped HfO$_2$ for High-Density MIM Capacitors," IEEE Electron Device Letters, vol. 24, No. 7, pp. 442-444, Jul. 2003.
Notice of Preliminary Rejection from the Korean Patent Office, mailed Sep. 30, 2005, in Patent Application No. 2003-89418, and English translation thereof.

*Primary Examiner*—Stephen W Smoot
(74) *Attorney, Agent, or Firm*—Finnegan, Henderson, Farabow, Garrett & Dunner, L.L.P.

(57) ABSTRACT

The present invention relates to a method for fabricating a capacitor in a semiconductor device through the use of hafnium-terbium oxide ($Hf_{1-x}Tb_xO$) as a dielectric layer. The method includes the steps of: forming a lower electrode on a substrate; forming an amorphous hafnium-terbium oxide ($Hf_{1-x}Tb_xO$) dielectric layer on the lower electrode; crystallizing the $Hf_{1-x}Tb_xO$ dielectric layer by performing a thermal process; and forming an upper electrode on the $Hf_{1-x}Tb_xO$ dielectric layer.

9 Claims, 2 Drawing Sheets

METHOD FOR FABRICATING CAPACITOR IN SEMICONDUCTOR DEVICE USING HAFNIUM TERBIUM OXIDE DIELECTRIC LAYER

CROSS-REFERENCE TO RELATED APPLICATIONS

This application is a divisional of application Ser. No. 10/879,745, filed Jun. 30, 2004, which was abandoned and claimed benefit of priority of Korean Patent Application No. 2003-89418, filed Dec. 10, 2003, all of which are incorporated herein by reference.

FIELD OF THE INVENTION

The present invention relates to a method for fabricating a capacitor in a semiconductor device; and, more particularly, to a method for fabricating a capacitor in a semiconductor device with use of hafnium-terbium oxide.

DESCRIPTION OF RELATED ARTS

A recent progression in micronization in semiconductor technology has led to acceleration in achieving a large-scale of integration of a memory device. As a result, a unit cell area is decreased and a required operation voltage becomes low. Although the unit cell area is decreased, a capacitance is required to be greater than 25 fF per cell in order to prevent incidences of soft error and shortened refresh time. Therefore, there have been diverse approaches to secure a required capacitance. For instance, in a capacitor for use in a dynamic random access memory (DRAM) device, wherein a silicon nitride ($Si_3N_4$) layer formed by employing dichlorosilane (DCS) gas is used as a dielectric layer for the capacitor, a lower electrode is formed in three dimensions and in the form of hemisphere of which surface area is large; and a height of the capacitor is increased.

However, the increased height of the capacitor creates a height difference between the cell region and the peripheral region, and this height difference adversely results in a difficulty in securing a depth of focus during a subsequent photo-exposure process. Hence, it is limited to have a capacitance of a capacitor required for the next generation DRAM device with a memory capacitance of over 256 megabytes.

Because of this limitation, the development of the capacitor has been currently focused to have an appropriate height along with a sufficient capacitance by using of a dielectric material having a high dielectric constant. Examples of such dielectric material are tantalum oxide ($Ta_2O_5$) having a dielectric constant of 25, hafnium oxide ($HfO_2$) having a dielectric constant ranging from 20 to 30 and alumina ($Al_2O_3$) having a dielectric constant of 9.

Despite of the use of the high dielectric material, a $Ta_2O_5$ dielectric layer is susceptible to leakage currents because the $Ta_2O_5$ dielectric layer becomes deteriorated by a thermal process performed after the formation of the $Ta_2O_5$ layer. Also, it is limited to form an $Al_2O_3$ dielectric layer with a sufficient capacitance because of a relatively low dielectric constant of $Al_2O_3$ compared with $HfO_2$ and $Ta_2O_5$. Further, an $HfO_2$ dielectric layer has a low intensity of breakdown voltage, thereby being susceptible to repeated electric stress. Thus, durability of a capacitor with the $HfO_2$ dielectric layer may become reduced.

SUMMARY OF THE INVENTION

It is, therefore, an object of the present invention to provide a method for fabricating a capacitor in a semiconductor device capable of improving reliability of a dielectric layer and securing a required capacitance for an operation of a highly integrated device.

In accordance with an aspect of the present invention, there is provided a method for fabricating a capacitor in a semiconductor device, including the steps of: forming a lower electrode on a substrate; forming an amorphous hafnium-terbium oxide ($Hf_{1-x}Tb_xO$) dielectric layer on the lower electrode; crystallizing the $Hf_{1-x}Tb_xO$ dielectric layer by performing a thermal process; and forming an upper electrode on the $Hf_{1-x}Tb_xO$ dielectric layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a capacitor in a semiconductor device in accordance with a preferred embodiment of the present invention will be described in detail with reference to the accompanying drawings.

Figure 1:
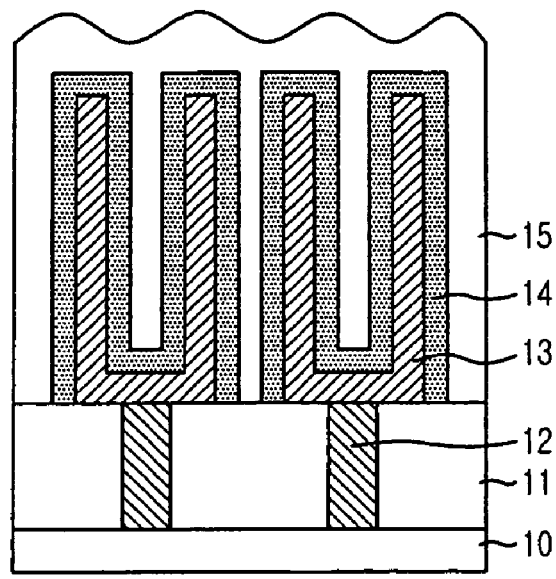
FIG. 1 is a cross-sectional view describing a method for fabricating a cylindrical capacitor in accordance with a first embodiment of the present invention.

FIG. 1 is a cross-sectional view illustrating a method for fabricating a cylindrical capacitor in accordance with a first embodiment of the present invention.

As shown, an inter-layer insulation layer 11 made of silicon dioxide ($SiO_2$) is formed on a semi-finished substrate 10. Although not illustrated, the semi-finished substrate 10 is provided with various device elements such as transistors and bit lines by performing predetermined processes for forming such device elements. Then, the inter-layer insulation layer 11 is etched to form contact holes 12A exposing predetermined portions of the substrate 10. A conductive material is deposited into the contact holes 12A and on the inter-layer insulation layer 11 until the contact holes 12A are filled with the conductive material. Afterwards, a chemical mechanical polishing (CMP) process or an etch-back process is performed to form contact plugs 12B connecting a subsequent lower electrode of a capacitor to the substrate 10.

Although not illustrated, an oxide layer for forming a capacitor is formed on the above resulting substrate structure and is then etched to form holes exposing the contact plugs 12B.

Next, a metal layer or a polysilicon layer for forming a lower electrode is formed on the holes and the oxide layer. Herein, the metal layer is made of a material selected from a group consisting of titanium nitride (TiN), ruthenium (Ru), tantalum nitride (TaN), tungsten (W), tungsten silicide (WSi), tungsten nitride (WN), ruthenium dioxide ($RuO_2$), iridium (Ir), and platinum (Pt). Then, a CMP process or an etch-back process is performed to the above metal or polysilicon layer. Thereafter, the oxide layer is removed to form cylindrical lower electrodes 13.

In case that the lower electrodes 13 are made of polysilicon, the lower electrodes 13 are subjected to a cleaning process before a dielectric layer 14 is formed for the purpose of removing a native oxide layer formed on the lower electrodes 13 and blocking hydrogen diffusions. For the cleaning process, hydrofluoric acid (HF) diluted with water preferably in a ratio of approximately 1 part of HF to approximately 10 parts to approximately 100 parts of water, or a mixed solution of deionized water (DI) and HF that is diluted with ammonium hydroxide ($NH_4OH$) in a ratio of 1 part of HF to approximately 5 parts to approximately 500 parts of $NH_4OH$ is preferably used.

Although not illustrated, a diffusion barrier layer made of a material selected from a family of silicon nitride ($SiN_x$) is formed on the lower electrodes 13 in order to prevent silicon or impurities from being diffused into a dielectric layer which will be subsequently formed. The diffusion barrier layer is formed by nitriding a surface of the lower electrodes 13 through performing one of a furnace annealing process and a rapid thermal process (RTP) in an atmosphere of ammonia ($NH_3$) gas.

Also, before and after the above cleaning process, it is possible to perform an additional cleaning process by using a mixed solution of ammonium hydroxide ($NH_4OH$), hydrogen peroxide ($H_2O_2$) and water ($H_2O$), a mixed solution of sulfuric acid ($H_2SO_4$) and $H_2O_2$, or a mixed solution of $H_2SO_4$ and $H_2O$ in order to remove organic or inorganic particles, or other impurities remaining on the lower electrodes 13 made of polysilicon.

Next, the above mentioned dielectric layer 14 is formed on the lower electrodes 13. At this time, the dielectric layer 14 is made of hafnium-terbium oxide ($Hf_{1-x}Tb_xO$) and has a thickness less than approximately 100 Å. Herein, a subscript x represents an atomic ratio of Tb.

More specifically, the $Hf_{1-x}Tb_xO$ dielectric layer 14 is formed by employing one of an atomic layer deposition (ALD) method or a low pressure chemical vapor deposition (LPCVD) method. At this time, such a material as $C_{16}H_{36}HfO_4$, or a precursor of Hf such an organic metal compound as tetrakis-diethylamino-hafnium (TDEAHf) and tetrakis-ethyl methylamino-hafnium (TEMAHf) is used as a source gas of Hf. For a source gas of Tb, such a material as $Tb(OC_2H_5)_3$, or a precursor of Tb such a Tb-containing organic metal compound as $Tb(CH_3)_3$ is used. Also, a reaction gas is selected from a group consisting of $O_3$, $O_2$ plasma gas and water vapor.

In addition, since a dielectric constant of the $Hf_{1-x}Tb_xO$ dielectric layer 14, a level of leakage currents and a breakdown voltage characteristic are determined by a Tb content, the atomic ratio of Tb, i.e., the subscript x, is set to be in a range between approximately 0.03 to approximately 0.1 in order to obtain a dielectric constant of the $Hf_{1-x}Tb_xO$ dielectric layer 14 in a range from approximately 30 to approximately 50. That is, if the $Hf_{1-x}Tb_xO$ dielectric layer 14 having a high dielectric constant ranging from approximately 30 to approximately 50 is formed by controlling the Tb content, it is possible to have a thickness of an equivalent oxide layer ranging from approximately 10 Å to approximately 20 Å. As a result of this effect, it is further possible to secure a sufficient capacitance of a capacitor, to have a level of leakage currents lower than a hafnium oxide ($HfO_2$) layer and to have a pronounced breakdown voltage characteristic. Also, since the $Hf_{1-x}Tb_xO$ dielectric layer 14 has a good thermal stability at a high temperature compared with the $HfO_2$ layer, it is possible to prevent degradation of an electric characteristic during a high thermal process for crystallizing the $Hf_{1-x}Tb_xO$ dielectric layer 14, thereby improving durability and reliability of a capacitor.

Preferably, a flow rate of each of the Hf and Tb source gases is controlled to be in a range from approximately 50 sccm to approximately 500 sccm. Meanwhile, a flow rate of the reaction gas is controlled to be in a range from approximately 0.1 slm to approximately 1 slm. In case that $O_3$ is used as the reaction gas, a concentration of the $O_3$ reaction gas is controlled to be in a range between approximately 220 g/m$^3$ and approximately 180 g/m$^3$.

If the $Hf_{1-x}Tb_xO$ dielectric layer 14 is formed by employing an ALD method, two cycles respectively for forming a $HfO_2$ layer and a terbium oxide ($Tb_xO_y$) layer, in which subscripts x and y represent a respective atomic ratio of Tb and O are repeatedly performed. Especially, a first cycle for forming the $HfO_2$ layer includes the sequential steps of providing a source gas of Hf, providing a purge gas such as $N_2$ or Ar gas, providing a reaction gas of $O_3$, and providing a purge gas such as $N_2$ or Ar gas, and a second cycle for forming the $Tb_xO_y$ layer includes the sequential steps of providing a source gas of Tb, providing a purge gas such as $N_2$ or Ar gas, providing a reaction gas of $O_3$, and providing a purge gas such as $N_2$ or Ar gas. Particularly, the first and the second cycles are repeated in a respective ratio less than approximately 9 to approximately 1. It is also possible to repeatedly perform a cycle including the sequential steps of providing a source gas of Hf, providing a purge gas of $N_2$ or Ar, providing a source gas of Tb, providing a purge gas of $N_2$ or Ar, providing a reaction gas of $O_3$, and providing a purge gas of $N_2$ or Ar. At this time, the number of providing the Hf source gas and that of providing the Tb source gas is set to be in a ratio less than approximately 9 to approximately 1.

If the LPCVD method is used to form the $Hf_{1-x}Tb_xO$ dielectric layer 14, inorganic metal compounds individually containing Hf and Tb are controlled to have a ratio of Hf and Tb less than approximately 9 to approximately 1 through the use of a flow controller such as a mass flow controller (MFC) and are then vaporized by a vaporizer maintained with a temperature ranging from approximately 150° C. to approximately 300° C. Thereafter, these Hf and Tb source gases are provided to a LPCVD reaction chamber maintained with a temperature ranging from approximately 250° C. to approximately 500° C.

Next, the $Hf_{1-x}Tb_xO$ dielectric layer 14 is crystallized by a thermal process to thereby have an improved dielectric characteristic. Herein, the thermal process is one of a furnace annealing process and a rapid thermal process (RTP) and proceeds under an increasing or a decreasing pressure and at a temperature ranging from approximately 500° C. to approximately 900° C. in an atmosphere of $N_2$, or in an atmosphere of $O_2$ and $N_2$ mixed in a ratio less than approximately 1 to approximately 10. Especially, this thermal process is performed for the purpose of removing impurities of carbon contained in the $Hf_{1-x}Tb_xO$ dielectric layer.

Afterwards, an upper electrode 15 is formed on the $Hf_{1-x}Tb_xO$ dielectric layer 14 by using a metal layer selected from a group consisting of TiN, Ru, TaN, W, WSi, WN, $RuO_2$, Ir, $IrO_2$, and Pt, or by using a polysilicon layer.

Although not illustrated, in case that the upper electrode 15 is made of polysilicon, a diffusion barrier layer made of a nitride-based material selected from a family of $SiN_x$ is formed between the upper electrode 15 and the $Hf_{1-x}Tb_xO$ dielectric layer 14. The diffusion barrier layer is formed by nitriding the $Hf_{1-x}Tb_xO$ dielectric layer 14 through the use of the same method applied for nitriding the lower electrode 13. Also, although not illustrated, a buffer layer is formed on the upper electrode 15 in order to maintain structural stability to humidity, temperature, or an electric shock. At this time, the buffer layer is made of polysilicon or silicon nitride and has a thickness ranging from approximately 200 Å to approximately 1000 Å.

Figure 2:
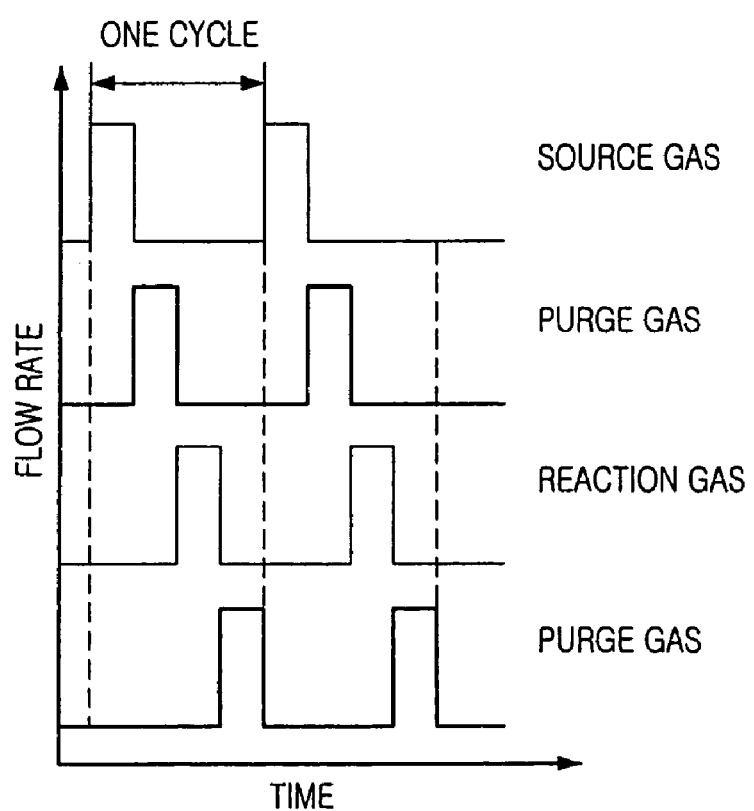
FIG. 2 is a diagram showing sequential steps of forming a hafnium-terbium oxide ($Hf_{1-x}Tb_xO$) layer, in which a subscript x representing an atomic ratio of terbium (Tb), by employing an atomic layer deposition method in accordance with the first embodiment of the present invention.

FIG. 2 is a diagram showing the above described cycles of the ALD method for forming a hafnium-terbium oxide ($Hf_{1-x}Tb_xO$) layer, in which a subscript x represents an atomic ratio of Tb in accordance with the first embodiment of the present invention. As shown, each cycle includes steps of sequentially providing a source gas, a purge gas, a reaction gas and a purge gas. More specifically, as described above, the $Hf_{1-x}Tb_xO$ dielectric layer 14 is formed by repeatedly performing two cycles respectively for forming a $HfO_2$ layer and a terbium oxide ($Tb_xO_y$) layer, in which subscripts x and y represent a respective atomic ratio of Tb and O. A first cycle for forming the $HfO_2$ layer includes the sequential steps of providing a source gas of Hf, providing a purge gas such as $N_2$ or Ar gas, providing a reaction gas of $O_3$, and providing a purge gas such as $N_2$ or Ar gas, and a second cycle for forming the $Tb_xO_y$ layer includes the sequential steps of providing a source gas of Tb, providing a purge gas such as $N_2$ or Ar gas, providing a reaction gas of $O_3$, and providing a purge gas such as $N_2$ or Ar gas.

Particularly, the first and the second cycles are repeated in a respective ratio less than approximately 9 to approximately 1. It is also possible to repeatedly perform a cycle including the sequential steps of providing a source gas of Hf, providing a purge gas of $N_2$ or Ar, providing a source gas of Tb, providing a purge gas of $N_2$ or Ar, providing a reaction gas of $O_3$, and providing a purge gas of $N_2$ or Ar. At this time, the number of providing the Hf source gas and that of providing the Tb source gas is set to be in a ratio less than approximately 9 to approximately 1.

In accordance with the first embodiment of the present invention, the $Hf_{1-x}Tb_xO$ layer is used as a dielectric layer of the capacitor to thereby obtain an equivalent oxide layer having a thickness (Tox) ranging from approximately 10 Å to approximately 20 Å and a high dielectric constant ranging from approximately 30 to approximately 50. As a result of this effect, it is possible to secure a sufficient capacitance of the capacitor required for operations of a highly integrated device. Also, reliability of the dielectric layer can be improved since it is possible to obtain a low level of leakage currents compared with an $HfO_2$ layer and a pronounced breakdown voltage characteristic. Furthermore, because of a good thermal stability in a high temperature, it is further possible to improve durability and reliability of the capacitor.

Meanwhile, although a case of applying a hemispherical grain structure or a concavo-convex structure to the lower electrode is not exemplified in the first embodiment, it is still possible to maximize a surface area of the capacitor by forming the lower electrode made of polysilicon and then applying the HSG or concavo-convex structure to the lower electrode.

Also, although the first embodiment of the present invention exemplifies a case of forming the lower electrode 13 in the form of cylinder, the first embodiment of the present invention can be applied to form a lower electrode in a concave type or an inner cylinder type.

Figure 3:
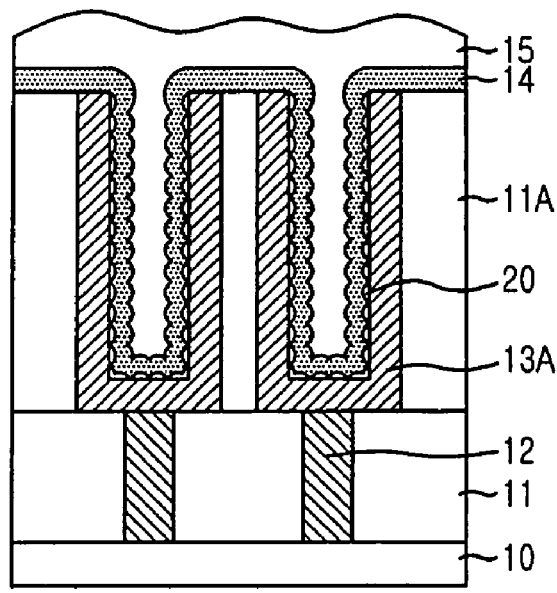
FIG. 3 is a cross-sectional view of a capacitor formed in the form of concave in accordance with a second embodiment of the present invention.
Figure 4:
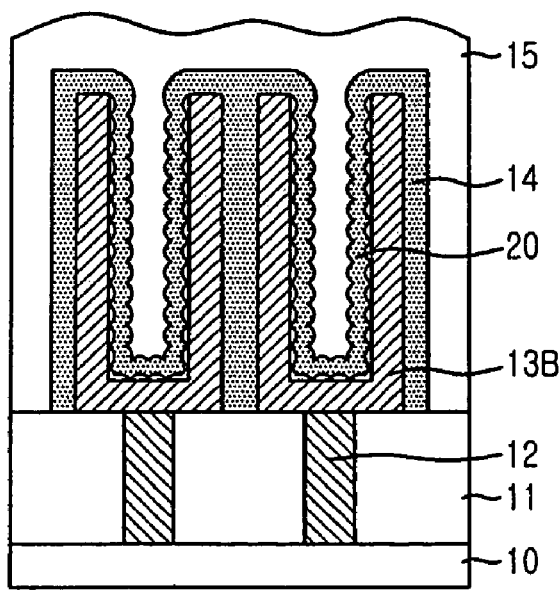
FIG. 4 is a cross-sectional view of a capacitor in the form of inner cylinder in accordance with a third embodiment of the present invention.

FIG. 3 shows a case of forming the lower electrode 13A in the concave type in accordance with a second embodiment of the present invention. Meanwhile, FIG. 4 shows a case of forming the lower electrode 13B in the inner hemispherical grain (HSG) cylinder type in accordance with a third embodiment of the present invention. Herein, the same reference numerals used in the first embodiment are used for the second embodiment and the third embodiment, and detailed description on the formation of the lower electrode 13A in the form of concave type and on that of the lower electrode 13B in the form of inner HSG cylinder type will be omitted. It should be noted that, unlike the cylindrical lower electrode 13 formed under a state that the capacitor oxide layer is removed, the lower electrode 13A is formed in the presence of a capacitor oxide layer 11A. In the mean time, the lower electrode 13B is formed by forming HSG on inner walls of the cylindrical lower electrode.

Furthermore, the first embodiment can be identically applied to a case that each of the lower electrode 13A formed in the cylinder type and the lower electrode 13B formed in the inner cylinder type is made of polysilicon to form the HSG structure or the concavo-convex structure on surfaces of the lower electrodes 13A and 13B. The reference numeral 20 in FIGS. 3 and 4 represents this HSG or concavo-convex structure.

In accordance with the first to the third preferred embodiments of the present invention, the dielectric layer made of $Hf_{1-x}Tb_xO$ makes it possible to improve reliability of the dielectric layer and secure a sufficient capacitance of the capacitor.

The present application contains subject matter related to the Korean patent application No. KR 2003-0089418, filed in the Korean Patent Office on Dec. 10, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor in a semiconductor device, the method comprising the steps of:
   forming a lower electrode on a substrate;
   forming an amorphous hafnium-terbium oxide ($Hf_{1-x}Tb_xO$) dielectric layer on the lower electrode;
   crystallizing the $Hf_{1-x}Tb_xO$ dielectric layer by performing a thermal process; and
   forming an upper electrode on the $Hf_{1-x}Tb_xO$ dielectric layer, wherein:
   the $Hf_{1-x}Tb_xO$ dielectric layer is formed with a thickness less than approximately 100 Å and the $Hf_{1-x}Tb_xO$ dielectric layer is formed by an atomic layer deposition (ALD) method; and
   the ALD method for forming the $Hf_{1-x}Tb_xO$ dielectric layer proceeds by repeatedly performing a cycle of sequentially providing a Hf-source gas, a purge gas, a Tb source gas, a purge gas, a reaction gas, and a purge gas.

2. The method of claim 1, wherein the $Hf_{1-x}Tb_xO$ dielectric layer is formed by using a source gas of hafnium (Hf) selected from a group consisting of $C_{16}H_{36}HfO_4$ and Hf-precursors of Hf-containing organic metal compounds.

3. The method of claim 2, wherein the Hf-source gas is supplied with a flow rate ranging from approximately 50 sccm to approximately 500 sccm.

4. The method of claim 1, wherein the $Hf_{1-x}Tb_xO$ dielectric layer is formed by using a source gas of Tb selected from a group consisting of $Tb(OC_2H_5)_3$ and Tb-precursors of Tb-containing organic metal compounds.

5. The method of claim 4, wherein the Tb-source gas is supplied with a flow rate ranging from approximately 50 sccm to approximately 500 sccm.

6. The method of claim 1, wherein a reaction gas for forming the $Hf_{1-x}Tb_xO$ dielectric layer is selected from a group consisting of $O_3$ gas, $O_2$ plasma gas and water vapor.

7. The method of claim 6, wherein the reaction gas is supplied with a flow rate ranging from approximately 0.1 slm to approximately 1 slm.

8. The method of claim 6, wherein if the $O_3$ gas is used as the reaction gas, a concentration of the $O_3$ gas is set to be in a range of approximately $200\pm20$ $g/m^3$.

9. The method of claim 1, wherein the ALD method for forming the $Hf_{1-x}Tb_xO$ dielectric layer is performed under a condition that the Hf source gas and the Tb source gas are provided in a ratio less than approximately 9 to approximately 1.

* * * * *